US010984940B2

(12) United States Patent
Sawyer

(10) Patent No.: US 10,984,940 B2
(45) Date of Patent: Apr. 20, 2021

(54) COMPRESSION HOUSING FOR A LAMINATE CORE OF AN INDUCTIVE CURRENT TRANSFORMER

(71) Applicant: Schweitzer Engineering Laboratories, Inc., Pullman, WA (US)

(72) Inventor: Eric M. Sawyer, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 305 days.

(21) Appl. No.: 16/214,822

(22) Filed: Dec. 10, 2018

(65) Prior Publication Data
US 2020/0185139 A1   Jun. 11, 2020

(51) Int. Cl.
| | |
|---|---|
| *H01F 17/02* | (2006.01) |
| *H01F 27/02* | (2006.01) |
| *H01F 17/04* | (2006.01) |
| *G01R 15/18* | (2006.01) |
| *H01F 41/02* | (2006.01) |
| *H01F 41/06* | (2016.01) |
| *H01F 27/28* | (2006.01) |

(52) U.S. Cl.
CPC .......... *H01F 27/02* (2013.01); *G01R 15/186* (2013.01); *H01F 17/04* (2013.01); *H01F 27/2823* (2013.01); *H01F 41/0206* (2013.01); *H01F 41/06* (2013.01)

(58) Field of Classification Search
CPC ...... H01F 27/02; H01F 17/04; H01F 41/0206; H01F 41/06; H01F 27/2823; H01F 27/263; H01F 38/30; G01R 15/186
See application file for complete search history.

(56) References Cited

U.S. PATENT DOCUMENTS

| | | | | | |
|---|---|---|---|---|---|
| 1,830,541 | A | * | 11/1931 | Harris ..................... | H01F 38/30 336/176 |
| 3,683,237 | A | * | 8/1972 | Walstad ................. | H02H 3/083 361/31 |
| 3,725,832 | A | * | 4/1973 | Schweitzer, Jr. ..... | H01F 41/024 336/96 |
| 4,048,605 | A | * | 9/1977 | McCollum ............ | H01F 27/245 336/176 |
| 4,262,209 | A | * | 4/1981 | Berner ..................... | F02G 5/02 290/7 |
| 4,456,873 | A | * | 6/1984 | Schweitzer, Jr. ..... | G01R 15/186 324/127 |
| 4,709,205 | A | | 11/1987 | Baurand | |

(Continued)

OTHER PUBLICATIONS

US 7,002,356 B2, 02/2006, Sarkozi (withdrawn)

*Primary Examiner* — Mang Tin Bik Lian
(74) *Attorney, Agent, or Firm* — Richard M. Edge

(57) ABSTRACT

A compression housing for a laminate core of an inductive current transformer is disclosed herein. The laminate core may include a portion wound with a secondary winding. The laminate core may be housed in the housing operable between opened and closed configurations. The compression housing may include contact plates for providing an electrical contact to the laminate core in closed configuration. The compression housing may include compression wedges to provide compression to the laminate core between the compression wedge and the contact plate. The current transformer may be used to obtain electric power and electric current measurements from a primary conductor.

16 Claims, 9 Drawing Sheets

(56) References Cited

U.S. PATENT DOCUMENTS

| | | | |
|---|---|---|---|
| 5,180,972 | A | 1/1993 | Schweitzer, Jr. |
| 5,418,514 | A * | 5/1995 | Smith .................... H01F 38/30 336/210 |
| 5,729,125 | A | 3/1998 | Schweitzer, Jr. |
| 6,211,764 | B1 | 4/2001 | Schweitzer, Jr. |
| 7,078,888 | B2 | 7/2006 | Budillon |
| 7,145,345 | B2 | 12/2006 | Sarkozi |
| 7,227,441 | B2 | 6/2007 | Skendzic |
| 7,474,192 | B2 | 1/2009 | Skendzic |
| 7,847,543 | B2 | 12/2010 | Gmo |
| 8,928,337 | B2 | 1/2015 | Kesler |
| 9,577,361 | B2 | 2/2017 | Benner |
| 10,128,590 | B2 | 11/2018 | Benner |
| 2006/0176047 | A1 * | 8/2006 | Lepine ................ G01R 15/207 324/117 R |
| 2011/0025304 | A1 | 2/2011 | Lint |
| 2011/0025305 | A1 | 2/2011 | Lint |
| 2011/0148561 | A1 | 6/2011 | Lint |
| 2016/0294448 | A1 | 10/2016 | Cano Rodriguez |

* cited by examiner

COMPRESSION HOUSING FOR A LAMINATE CORE OF AN INDUCTIVE CURRENT TRANSFORMER

TECHNICAL FIELD

The present disclosure relates generally to current transformers. Specifically, the present disclosure relates to a compression housing for a laminate core of an inductive current transformer.

BRIEF DESCRIPTION OF THE DRAWINGS

The written disclosure herein describes illustrative embodiments that are non-limiting and non-exhaustive. Reference is made to certain of such illustrative embodiments that are depicted in the figures described below.

DETAILED DESCRIPTION

Figure 1:
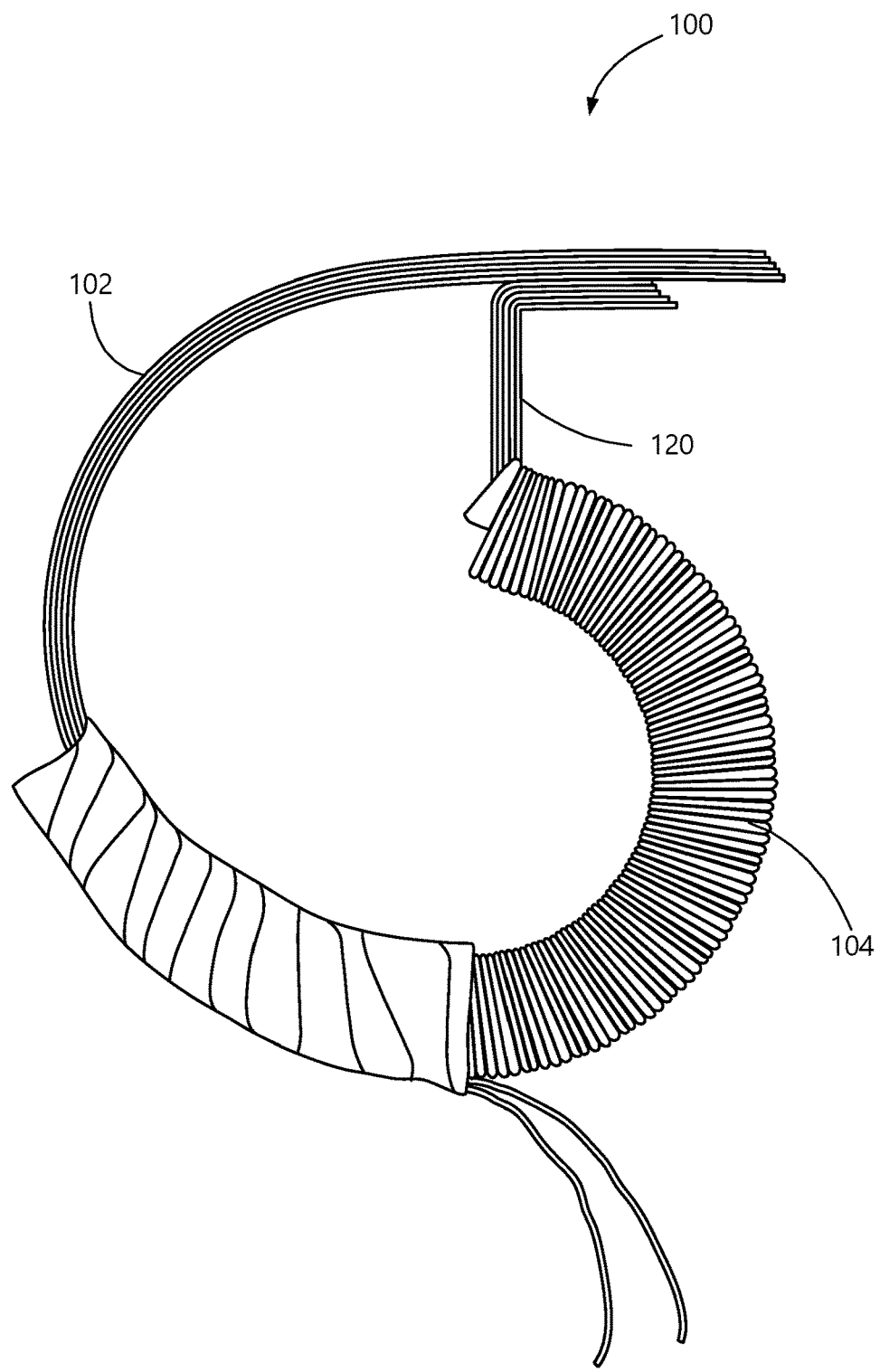
FIG. 1 illustrates a side view of a laminate core of a current transformer including a secondary winding.

This disclosure describes an electronic device that includes a compression housing for a laminate core of an inductive current transformer. A current transformer transfers electrical energy between two circuits through electromagnetic induction. The current transferred to a secondary circuit by the current transformer is proportional to the current on a primary circuit. The proportionality facilitates safe and accurate measurement of large currents. For example, a current transformer placed on a high-voltage power line produces a smaller current that can be measured allowing the current on the high voltage power line to be calculated using the proportionality of the current transformer. Furthermore, a current transformer placed on a high-voltage power line may be used to parasitically obtain electric power from the power line for powering the electronic device.

Current transformers may be effective in several different forms. Certain current transformers include a core wound with a secondary winding. The wound core may encircle a conductor (or primary winding) such that a primary current through the conductor (or primary winding) induces a secondary current through the secondary winding that is proportional to the current in the primary. The proportionality between the primary and secondary currents is a result of a ratio of the primary windings to the secondary windings.

Various configurations of current transformers are used to obtain secondary current signals from conductors. For example, current transformers may include a toroidal core wound with secondary windings for a permanent installation. Toroidal cores make installation and removal of the current transformer difficult. Other configurations include a flexible split core that may be opened and closed for easy installation and removal. Flexible split-core current transformers may include a core that is made from laminations of a conductive metal such as steel. Each lamination may be formed from a separate layer of the conductive metal. Each layer may be separated by a thin insulating layer to reduce core losses due to eddy currents in each layer. Furthermore, each laminate layer may be held together tightly to reduce core losses.

In several configurations, the wound laminate core is formed as a split core with a portion intended to be opened or split so as to mount the current transformer onto a primary conductor. The wound laminate core may include a first unwound portion and a second unwound portion, with the wound portion between the first and second unwound portions. For the current transformer to function properly, the portion intended to be opened must be closed such that the core becomes a closed electrical circuit. That is, an electrical contact must be formed between the first and second unwound portions of the core. Gaps between the core and a contact may reduce electrical conductivity of the closed loop, which decreases the utility of the transformer. Accordingly, improved contact between the core and electrical contacts at the opening portion of the core is needed.

In various embodiments, current transformers are used in electronic devices mounted on a primary conductor and used to detect primary current in the primary conductor, and communicate electrical attributes associated with the detected primary current. The electronic device may be configured to obtain current measurements from the primary conductor, and may further parasitically obtain operating power from the primary conductor. The electronic device may include a current transformer to obtain electrical measurements. The current transformer may also parasitically obtain operating power from the primary conductor. Accordingly, current transformers must be sufficiently accurate for accurate reporting. Transformer losses due to gaps in lamination or gaps between the laminated core and the opening contacts may result in reduced accuracy, and may result in a reduction in the parasitic electric power obtained for the electronic device. Accordingly, what is needed is improved contact between the core and the electrical contacts at the opening portion of the core.

Disclosed herein are embodiments of compression housing for a laminate core of a current transformer. The compression may reduce gaps between laminate layers of the core and may reduce gaps between the core and electrical contacts at the opening portion of the core. In various embodiments, a housing with tapered mounting members to cooperate with an adjustable compression wedge are used to adjustably compress the laminate core against the electrical contact at the opening portion of the core. The adjustable compression wedge may be used to increase the compression and reduce gaps between the laminate core and the electrical contact. The adjustment may be performed by tightening a mounting screw. The adjustable compression housing may further hold the laminate layers in alignment during repeated opening and closing of the core to reduce slippage and gaps between laminate layers and between the laminate core and the electrical contacts.

As used herein, the phrases "coupled to," "communicatively coupled to," and "in communication with" are broad enough to refer to any suitable coupling or other form of interaction between two or more components, including electrically, mechanical, fluid, and thermal interaction. Two components may be coupled to each other even though there may be intermediary devices between the two components.

A flexible CT may provide a current to a protection relay or relay for monitoring. The protection relay or relay can open and/or close one or more circuits electromechanically or electronically. A relay may protect distribution or transmission circuits by tripping and closing a breaker under abnormal conditions. Protective relays can prevent equipment damage by detecting electrical abnormalities, including an arc flash event, faults, unbalance conditions, overcurrent conditions, power swing conditions, and the like.

An intelligent electronic device (IED), which may be used for monitoring, protecting, and/or controlling industrial and utility equipment, such as in electric power delivery systems, may include a low-leakage flexible CT. As used herein, an IED may refer to any one or combination of a central processing unit (CPU)-based relay and/or protective relay, a communication processor, a digital fault recorder, a phasor measurement unit (PMU), a phasor measurement and control unit (PMCU), a phasor data concentrator (PDC), a wide area control system (WACS), a relay with phasor measurement capabilities, a wide area protection system (WAPS), a Supervisory Control and Data Acquisition (SCADA) system, a system integrity protection scheme, or any other device capable of monitoring and/or protecting an electrical power system. The term "IED" may be used interchangeably to describe an individual IED or a system comprising multiple IEDs.

Embodiments may be understood by reference to the drawings, wherein like parts are designated by like numerals throughout. The components of the embodiments as generally described and illustrated in the figures herein can be arranged and designed in a wide variety of different configurations. Thus, the following more detailed description of various embodiments, as represented in the figures, is not intended to limit the scope of the present disclosure, but is merely representative of various embodiments. While various aspects of the embodiments are presented in drawings, the drawings are not necessarily drawn to scale unless specifically indicated. In addition, the steps of a method do not necessarily need to be executed in any specific order, or even sequentially, nor need the steps be executed only once, unless otherwise specified.

FIG. 1 illustrates a side view of a flexible split-core current transformer 100. The current transformer includes a laminate core 102 that includes a number of laminate layers. The flexible split-core current transformer 100 may include a secondary winding 104 wound around the laminate core 102 such that the secondary winding covers at least a portion of the laminate core 102. In certain embodiments, the secondary winding 104 covers only a portion of the laminate core 102. In other embodiments, the secondary winding 104 covers a majority of the laminate core 102, and may even cover all of the section of the laminate core 102 that encircles the primary winding (or primary conductor). The secondary winding 104 may include a continuous (or electrically continuous) length of wire axially coiled around the core. The laminate core 102 may include a bent portion 120 to facilitate an electrical contact area between the first and second unwound portions of the laminate core configured to be flexibly opened to admit the primary winding or conductor to be encircled by the current transformer. As discussed above, what is needed is reduction of gaps between the laminate layers and between the laminate core and electrical contacts at the opening portion to reduce the core losses of the current transformer.

Figure 2:
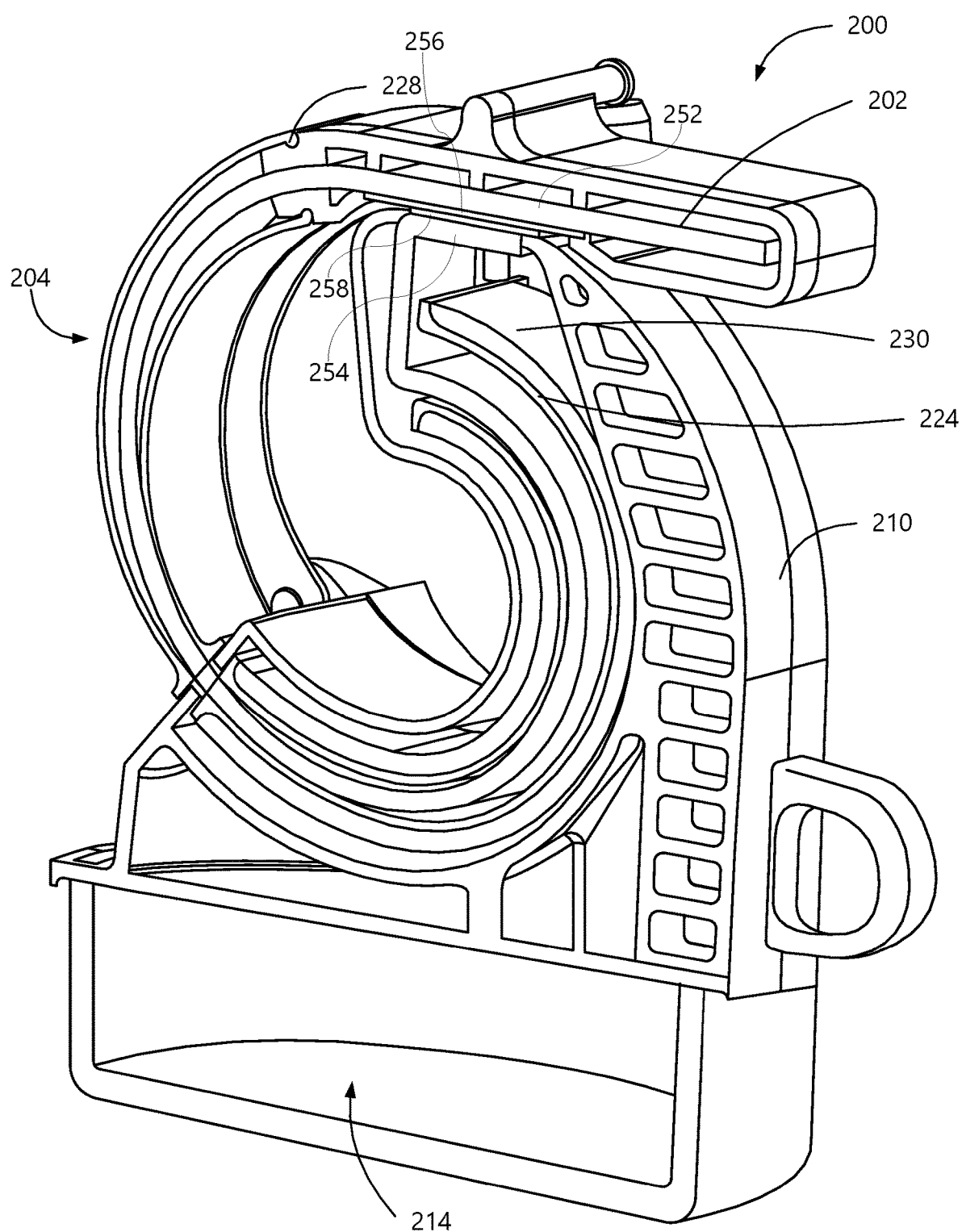
FIG. 2 illustrates a cross sectional perspective view of an electronic device including a current transformer.

FIG. 2 illustrates a cross sectional perspective view of an electronic device 200 that includes a flexible split core current transformer such as the current transformer previously illustrated mounted in an enclosure 210. As illustrated, secondary windings 230 may be wrapped around a winding portion 224 of a flexible bobbin 220, which may cover a wrapped portion of the core 202.

As shown, the flexible current transformer may comprise a pre-formed core 202, a flexible bobbin 220, and an axially wound secondary winding 230. The pre-formed core 202 may be semi-rigid to allow the pre-formed core 202 to be bent to open the flexible current transformer. The housing 210 may provide protection from rain, snow, hail, and sun. A chamber 214 may protect electronics, cables, and/or IEDs coupled to the electronic device 200.

The enclosure 210 may be made of a rigid material, such as plastic. The rigidity may provide protection to the current transformer. A portion of the housing 204 may be configured to hinge open. The rigid housing 210 may include a fixed member and a hinged member, where the hinged member houses a portion of the flexible current transformer. The hinged member may be formed of a rigid material such as a plastic, and may be moveably connected to the fixed member to allow hinged opening of the housing with the flexible current transformer flexing open and closed as the hinged member hinges open and closed with respect to the fixed member of the housing. Accordingly, the housing may be operable between an open position and a closed position.

The core 202 may include a first contact portion 252 and a second contact portion 254 that form an opening portion. Upon the current transformer being flexed or hinged open, the first and second contact portions 252, 254 separate to provide an opening through which a primary conductor may pass into the sensing area of the current transformer during installation of the electronic device 200; and pass out of the sensing area of the current transformer during removal of the electronic device 200. The first and second contact portions 252, 254 may be forced together by the flexible core, springs, or other closing members. The first and second contact portions 252, 254 may be alternatively referred to herein as first and second unwound portions 252, 254. A first contact plate 256 may be in electrical communication with the first contact portion 252 of the core, and a second contact plate 258 may be in electrical communication with the second contact portion 254 to facilitate electrical contact between the first contact portion 252 and the second contact portion 254. The contact plates 256, 258 may be formed from an electrically conductive material. The contact plates 256, 258 may be formed from a weather-resistant material. In certain embodiments, the contact plates 256, 258 are formed from nickel or a nickel alloy.

As described above, improvement in the electrical connection between the first unwound portion 252 and the first contact plate 256; and in the electrical connection between the second unwound portion 254 and the second contact plate 258, also may improve efficiency of the current transformer. Improvement of such electrical connections may also reduce core losses of the current transformer. Accordingly, improvement of such electrical connections may provide increased accuracy of the current transformer and increased parasitic power available to the electronic device 200.

Figure 3:
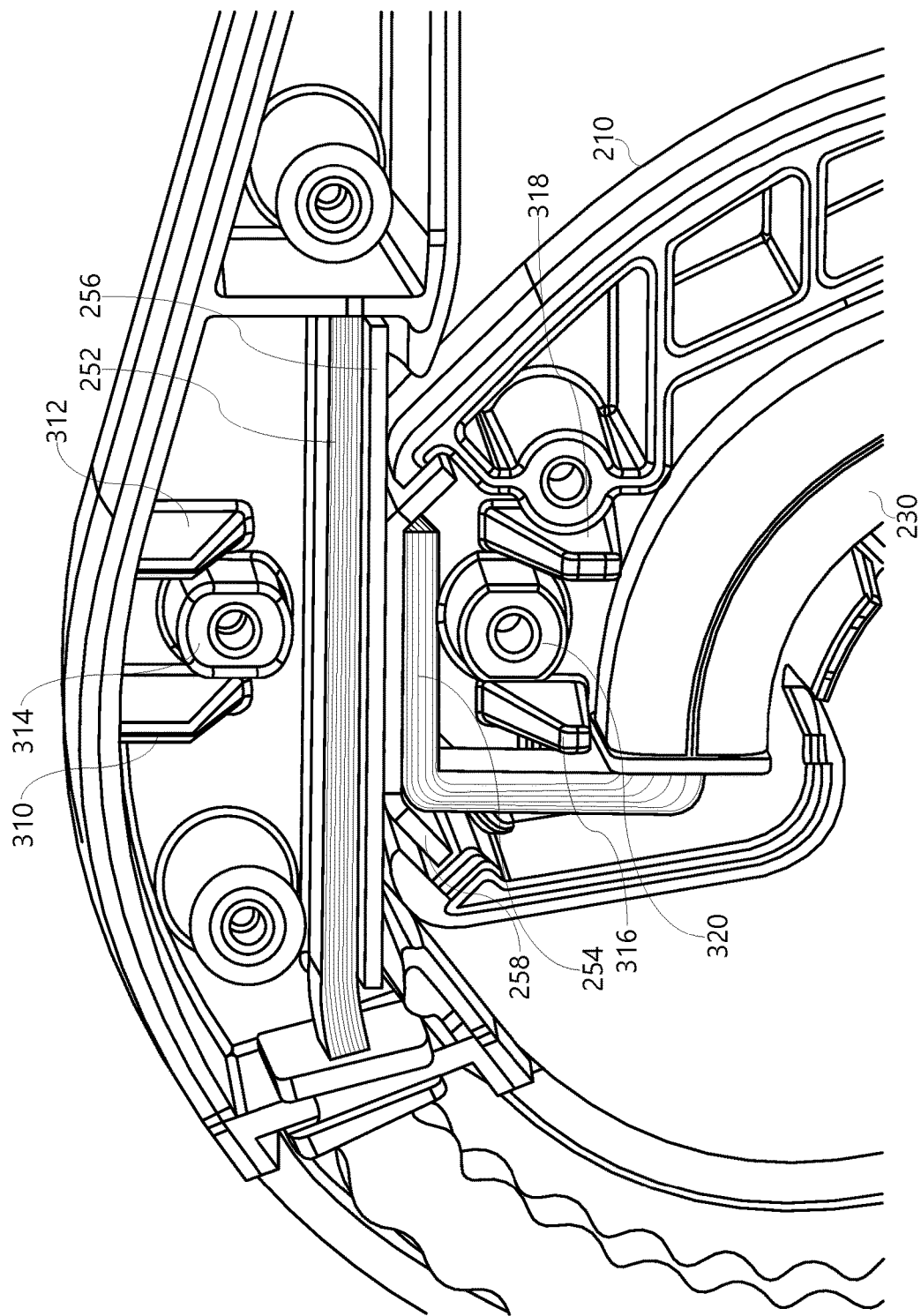
FIG. 3 illustrates a cross sectional view of a current transformer with contact plates and a housing structure for compression of the laminate core.

FIG. 3 illustrates a cross sectional view of a portion of an electronic device that includes a compression housing 210 for a current transformer in accordance with several embodiments herein. The housing 210 is configured to house the core 202, the secondary winding 230, first and second contact plates 256, 258, and other components. To facilitate compression of the laminate core and the contact plates, the housing comprises features that allow mounting of a compression wedge discussed hereinafter. To facilitate compression of the first unwound portion 252 of laminate core 202 and the first contact plate 256, the housing 210 includes a pair of tapered guide ramps 310, 312 of an upper portion of the housing 210. The tapered guide ramps 310, 312 may be tapered with respect to the first portion 252 of the laminate core 202 such that installation of a compression wedge will apply compression to the first portion 252 of the laminate core 202 between the compression wedge and the first contact plate 256. The upper portion further may include a mounting surface 314 to which the compression wedge may be attached. The mounting surface 314 may include an aperture for accepting a mounting member such as a screw, self-taping screw, or the like.

Similarly, the lower portion of the housing, which may house the second portion 254 of the laminate core 202 and the second contact plate 258, may include various features that allow mounting of a compression wedge. To facilitate compression of the second portion 254 of laminate core 202 and the second contact plate 258, the housing 210 includes a pair of tapered guide ramps 316, 318 of the lower portion of the housing 210. The tapered guide ramps 316, 318 may be tapered with respect to the second portion 254 of the laminate core 202 such that installation of a compression wedge may apply compression to the second portion 254 of the laminate core 202 between the compression wedge and the second contact plate 258. The lower portion further may include a mounting surface 320 to which the compression wedge may be attached. The mounting surface 320 may include an aperture for accepting a mounting member such as a screw, self-taping screw, or the like.

Figure 4:
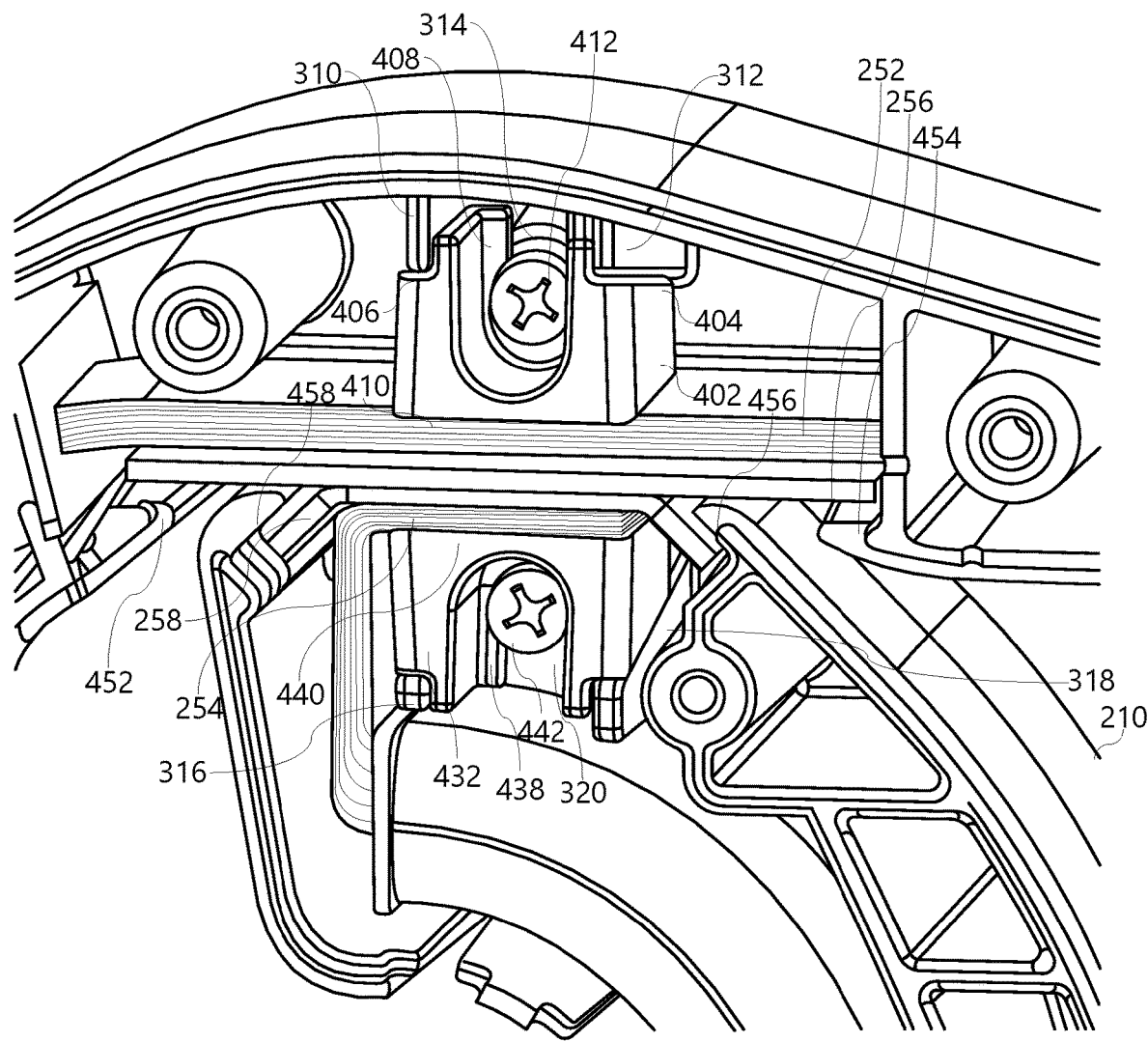
FIG. 4 illustrates a cross sectional view of a compression housing for a laminate core of a current transformer.

FIG. 4 illustrates another cross-sectional view of an electronic device that includes the compression housing 210 of FIG. 3, including compression wedges 402, 432. The upper portion may have a first compression wedge 402 mounted to the upper portion of the housing 210 using the various mounting features. The compression wedge 402 may include tapered ramps 404, 406 in contact with the tapered guide ramps 310, 312. A mounting member 412 such as a screw or self-taping screw may be used to mount the compression wedge 402 to the mounting surface 314 by communication with a tightening surface 408 of the compression wedge 402. As the mounting member 412 is tightened into the mounting surface 314, it forces the compression wedge 402 toward the mounting surface by force on the tightening surface 408 by the tightening of the mounting member 412. Due to cooperation between the tapered guide ramps 310, 312 and the tapered ramps 404, 406 of the compression wedge 402, as the compression wedge 402 is tightened against or travels toward the mounting surface 314, the compression wedge 402 is forced toward the first portion 252 of the laminate core 202. The compression wedge 402 may include a compression surface 410 in communication with the first portion 252 of the laminate core 202 such that as the mounting member 412 is tightened, the wedge 402 applies force toward the first portion 252 of the laminate core 202. Accordingly, tightening the mounting member 412 increases pressure between compression surface 410 and first unwound portion 252.

The first portion 252 of the laminate core 202 may be, therefore, compressed between the compression surface 410 of the compression wedge 402 and the contact plate 256. The upper portion of the housing 210 may include contact plate guides 452, 454 to secure the first contact plate 256 against compression force applied to the first portion 252 of the laminate core 202 by the compression wedge 402. Accordingly, the compression wedge 402 may be mounted to the upper portion of the housing 210 using the mounting member 412 to secure the compression wedge 402 to the housing, which securing may compress the first portion 252 of the laminate core 202 against the first contact plate 256 due to cooperation with the tapered guide ramps 310, 312 and the tapered ramps 404, 406 of the compression wedge 402. Tightening of the mounting member 412, therefore increases compression of the first portion 252 of the laminate core 202 with the contact plate 256.

Similarly, the lower portion may house a second compression wedge 432 mounted to the lower portion of the housing 210 using the various mounting features. The compression wedge 432 may include tapered ramps in contact with the tapered guide ramps 316, 318. A mounting member 442 such as a screw or self-taping screw may be used to mount the compression wedge 432 to the mounting surface 320 by communication with a tightening surface 438 of the compression wedge 432. As the mounting member 442 is tightened into the mounting surface 320, it forces the compression wedge 432 toward the mounting surface by force on the tightening surface 438 by the tightening of the mounting member 442. Due to cooperation between the tapered guide ramps 316, 318 and the tapered ramps of the compression wedge 432, as the compression wedge 432 is tightened against or travels toward the mounting surface 320 the compression wedge 432 is forced toward the second portion 254 of the laminate core 202. The compression wedge 432 may include a compression surface 440 in communication with the second portion 254 of the laminate core 202 such that as the mounting member 442 is tightened, the wedge 432 applies force toward the second portion 254 of the laminate core 202. Accordingly, tightening the mounting member 442 increases pressure between surface 440 and second unwound portion 254.

The second portion 254 of the laminate core 202 may be, therefore, compressed between the compression surface 440 of the compression wedge 432 and the contact plate 258. The lower portion of the housing 210 may include contact plate guides 456, 458 to secure the second contact plate 258 against compression force applied to the second portion 254 of the laminate core 202 by the compression wedge 432. Accordingly, the compression wedge 432 may be mounted to the lower portion of the housing 210 using the mounting member 442 to secure the compression wedge 432 to the housing, which securing may compress the second portion 254 of the laminate core 202 against the second contact plate 258 due to the tapered guide ramps 316, 318 and the tapered ramps of the compression wedge 432. Tightening of the mounting member 442 increases compression of the second portion 254 of the laminate core 202 with the contact plate 258.

Figure 5:
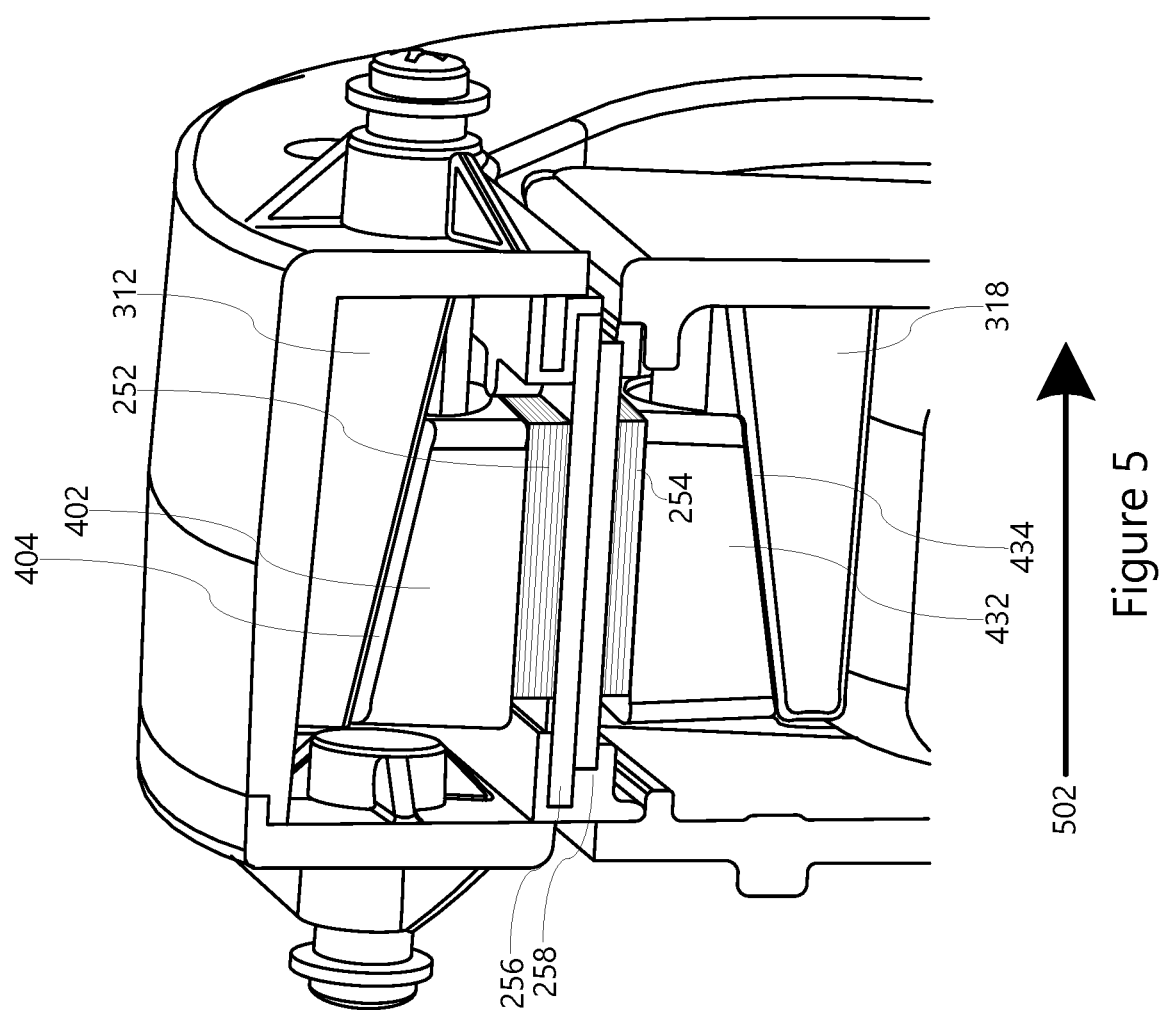
FIG. 5 illustrates a cross sectional view of a compression housing for a laminate core of a current transformer.

FIG. 5 illustrates another cross-sectional view of an embodiment of compression housing for a flexible split-core transformer. This view us useful to illustrate the cooperation of the tapered guide ramps 312, 318 and the tapered ramps 404, 434 of the compression wedges 402, 432. In particular, tightening of the mounting members 412, 442 exerts a force on the compression wedges 402, 432 in the direction 502 toward the mounting surfaces 314, 320. Due to the cooperation of the tapered guide ramps 312, 318 and the tapered ramps 404, 434 of the compression wedges 402, 432, the compression wedges 402, 432 also exert a force toward the respective contact plates 256, 258. Accordingly, the first portion 252 of the laminate core 202 is compressed between compression wedge 402 and the first contact plate 256; and the second portion 254 of the laminate core 202 is compressed between compression wedge 432 and the second contact plate 258. Such compression may reduce gaps between the laminate layers of the laminate core 202; reduce gaps between the laminate core and the contact plates 256, 258; and hold the laminate core in position. Such compression may increase the electrical conductivity of the laminate core and may reduce core losses.

Figure 6:
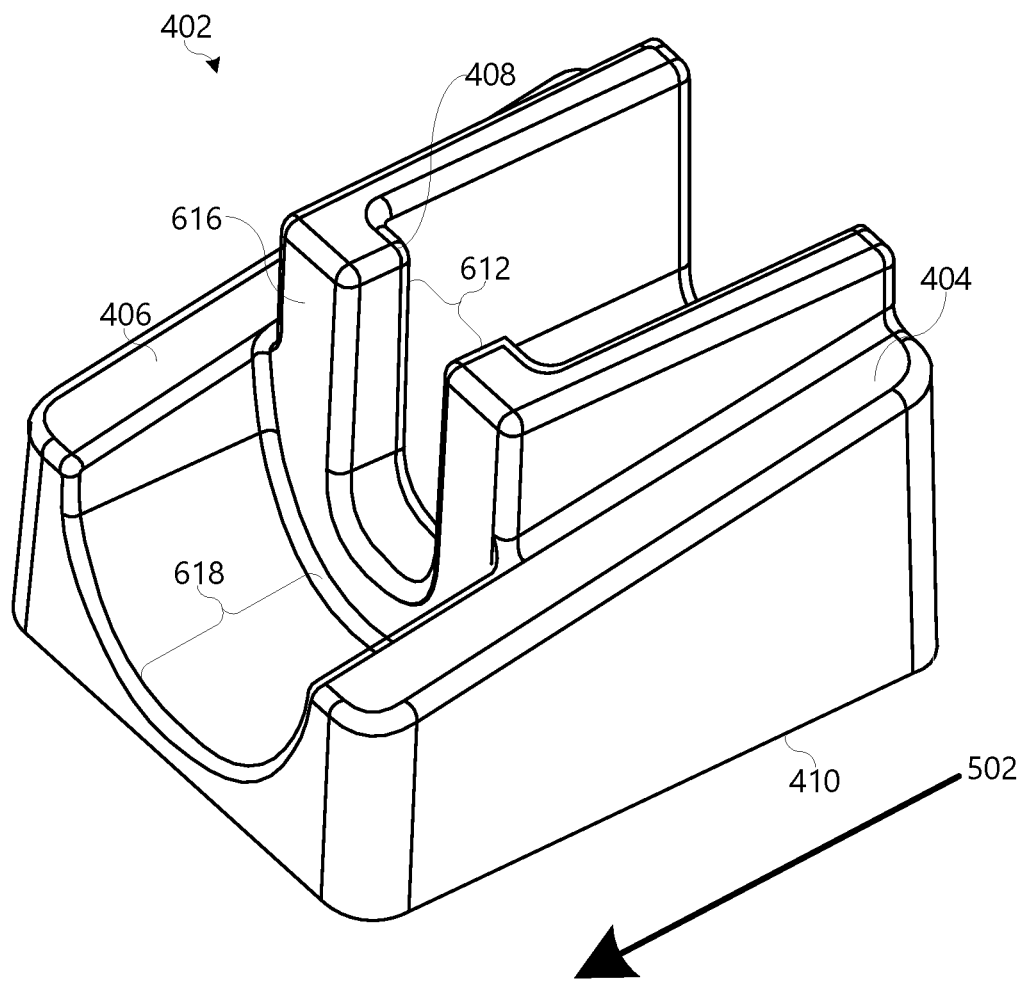
FIG. 6 illustrates a perspective view of an adjustable compression wedge that may be used with the compression housing.

FIG. 6 illustrates a perspective view of a compression wedge 402 in accordance with several embodiments herein. Although the compression wedge 402 (which cooperates with the upper portion of the housing 210) is illustrated, the illustrated embodiment may be used as compression wedge 432 (which cooperates with the lower portion of the housing 210). In various embodiments, compression wedges 402, 432 may be identical. In other embodiments, compression wedges 402, 432 may not be identical, with different dimensions, different tapering of the ramps, and so forth.

As illustrated, the compression wedge 402 includes tapered ramps 404, 406 for cooperation with tapered guide ramps 312, 318. In certain embodiments, the tapered ramps 404, 406 may have identical slopes relative to the compression surface 410. In certain other embodiments, the tapered ramps 404, 406 may have different slopes relative to the compression surface 410. The compression wedge 402 may include a tightening surface 408 against which the mounting member 412 may, upon tightening thereof, apply a force in the direction 502 toward the mounting surface 314 of the housing 210. The compression wedge 402 may include an opening 612 defined by the tightening surface 408 that may extend generally in a direction perpendicular to direction 502 such that as the compression wedge 402 travels in direction 502 it may also be free to travel toward the compression surface 410 without restriction by the mounting member. That is, the screw can remain generally fixed in relation to the housing while the compression wedge travels toward the first unwound portion 252.

The compression wedge 402 may also include a setback 618 of the tightening surface 408. The setback 618 may allow for the compression wedge 402 to travel toward the mounting surface 314 upon tightening of the mounting member 412. The mounting member 412 may be tightened to the point that a contact surface 616 of the compression wedge contacts the mounting surface 314. In various embodiments, the mounting surface 314 may extend from the housing 210 into the setback 618. Such an extension of the mounting surface 314 into the setback 618 may provide further structural support for the compression wedge 402. In various embodiments the mounting surface 314 may partially extend from the housing 210 into the setback 618 such that the compression wedge 402 may be free to travel toward the mounting surface 314 upon tightening of the mounting member 412 while still providing a degree of structural support for the compression wedge 402. In various embodiments, the setback 618 may be tapered with a slope similar to a taper of the mounting surface 314 such that the mounting surface 314 cooperates with the setback 618 similarly to the cooperation between the tapered ramps 404, 406 with the tapered guide ramps 312, 318. Such cooperation may result in a force in the direction of the compression surface 410 upon tightening of the mounting member 412.

Various different embodiments of the compression wedge 402 are contemplated. In one embodiment, the compression wedge 402 may include a single tapered ramp such as tapered ramp 404. In one embodiment, the tapered ramp may be a tapered setback 618 without the separate tapered ramps 404 and 406.

In various embodiments, the compression wedge 402 may be attached to the body 210 using a single mounting member 412. In other embodiments, the compression wedge 402 may be attached to the body 210 using multiple mounting members 412. Multiple mounting members may allow for different adjustments to the compression wedge.

In various embodiments the compression wedge 402 may be formed from a rigid or semi-rigid material. In various embodiments the compression wedge 402 may be formed from an electrically insulating material, or a material with an electrical conductivity less than that of the laminate core 202. In various embodiments, the compression wedge 402 may be formed from the same material as the housing 210. The compression wedge 402 may be formed from plastic.

In certain embodiments, the compression wedge 402 (or 432) is designed to apply the appropriate compression to the laminate core when adjusted such that the contact surface 616 is in contact with the mounting surface 314 (or 320). According to such embodiments, the compression wedge 402 (or 432) is appropriately adjusted by tightening the mounting member 412 (or 442) sufficiently to drive the contact surface 616 into contact with the mounting surface 314 (or 320).

In certain embodiments, the compression wedge 402 (or 432) is designed to apply the appropriate compression to the laminate core when adjusted at a point where the mounting member 412 (or 442) is tightened to a predetermined torque. According to such embodiments, the compression wedge 402 (or 432) is appropriately adjusted by tightening the mounting member 412 (or 442) until the predetermined torque on the mounting member 412 (or 442) is achieved.

In various embodiments, the predetermined torque on the mounting member 412 (or 442) corresponds with the contact surface 616 of the compression wedge 402 (or 432) contacting the mounting surface 314 (or 320). In such embodiments, the compression wedge 402 (or 432) is appropriately adjusted by tightening the mounting member 412 (or 442) until the predetermined torque is reached, indicating that the contact surface 616 of the compression wedge 402 (or 432) is in contact with the mounting surface 314 (or 320), but is not over-tightened to a point where components may be damaged or approach failure.

Figure 7:
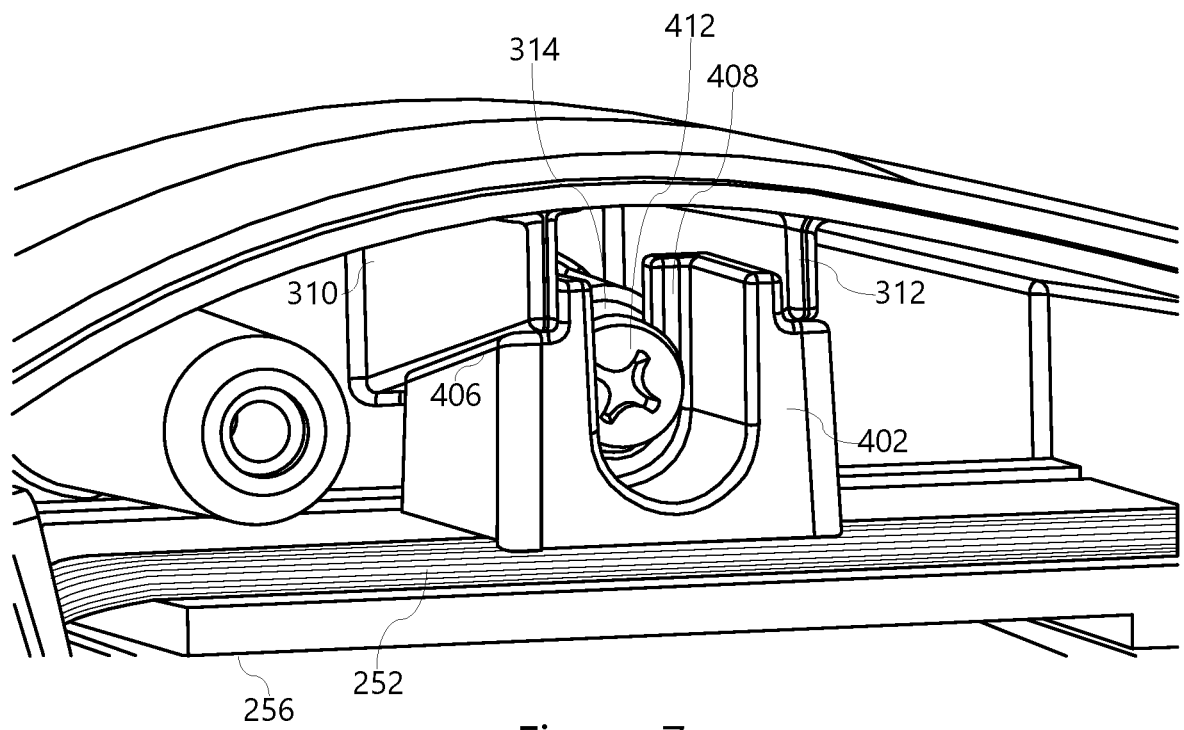
FIG. 7 illustrates a cross sectional view of a top member of a compression housing for a laminate core of a current transformer.

FIG. 7 illustrates a more detailed cross-sectional view of an upper portion of the electronic device. The tapered guide ramps 310, 312 are illustrated as formed portions of the housing 210. In alternative embodiments, the tapered guide ramps 310, 312 may be attached to the housing 210. In various embodiments, the tapered guide ramps 310, 312 are not identical to comply with a curvature of the housing 210. The tapered guide ramps 310, 312 may be identical, or may have different geometry or dimension. In one embodiment, the tapered guide ramps 310, 312 include parallel ramps. The parallel ramps may form a plane that is not parallel to a plane of the first electrical contact plate 256. The parallel ramps may form a plane that is parallel to a plane formed from tapered ramps 404, 406 of the first compression wedge 402 when the compression surface is parallel with the contact plate.

Figure 8:
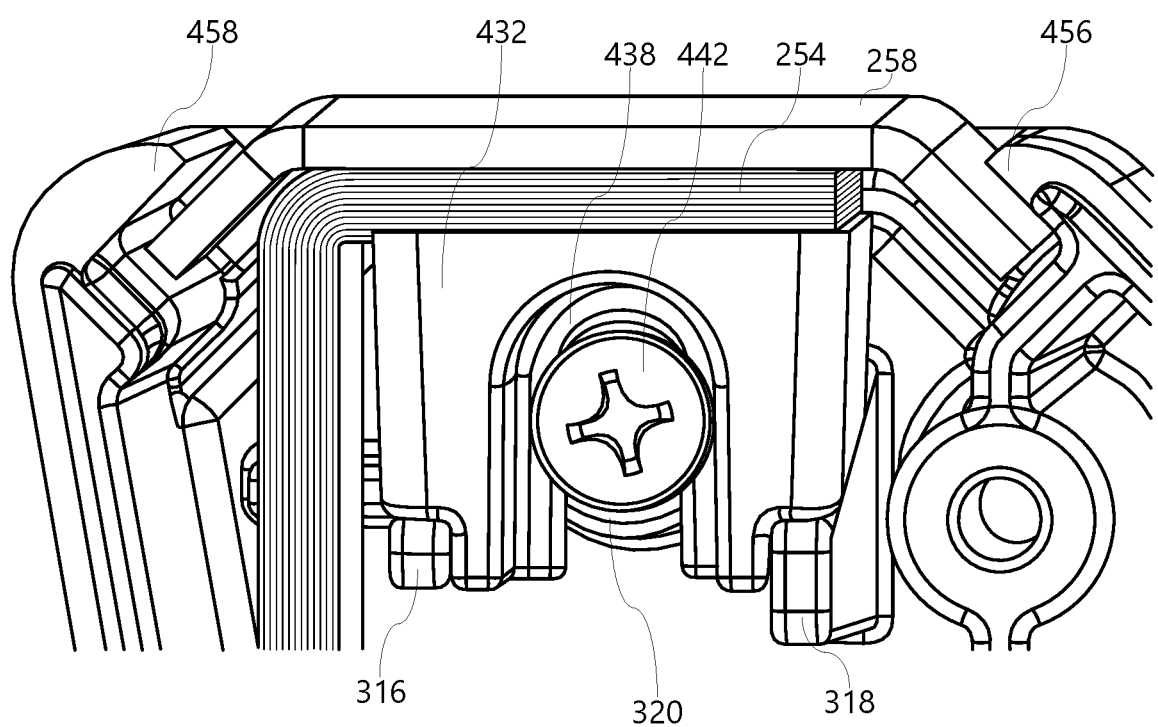
FIG. 8 illustrates a cross sectional view of a bottom member of a compression housing for a laminate core of a current transformer.

FIG. 8 illustrates a more detailed cross-sectional view of a lower portion of the electronic device. The tapered guide ramps 316, 318 are illustrated as formed portions of the housing 210. In alternative embodiments, the tapered guide ramps 316, 318 may be attached to the housing 210. In various embodiments, the tapered guide ramps 316, 318 are not identical to comply with other components of the electronic device such as a wound portion of the core. The tapered guide ramps 316, 318 may be identical, or may have different geometry or dimension. In one embodiment, the tapered guide ramps 316, 318 include parallel ramps. The parallel ramps may form a plane that is not parallel to a plane of the second electrical contact plate 258. The parallel ramps may form a plane that is parallel to a plane formed from tapered ramps of the second compression wedge 432 when the compression surface is parallel with the contact plate.

The second electrical contact plate 258 may be bent to conform to contact plate guides 456, 458. The second electrical contact plate 258 may include a flat portion to contact a flat portion of the first contact plate 256 of the upper portion. In various embodiments, the second electrical contact plate 258 may be formed to cooperate with the contact plate guides 456, 458 such that the flat portion of the second contact plate 258 extends outside of the contact plate guides 456, 458. Such extension may facilitate contact between the first and second contact plates 256, 258 without contact between the upper portion of the housing and the lower portion of the housing. In various embodiments, the flat portion of the second contact plate 258 may extend into the first portion of the housing to contact the first contact plate 256 when the current transformer is in a closed position. In other embodiments, the second electrical contact plate 258 may be flat.

Figure 9:
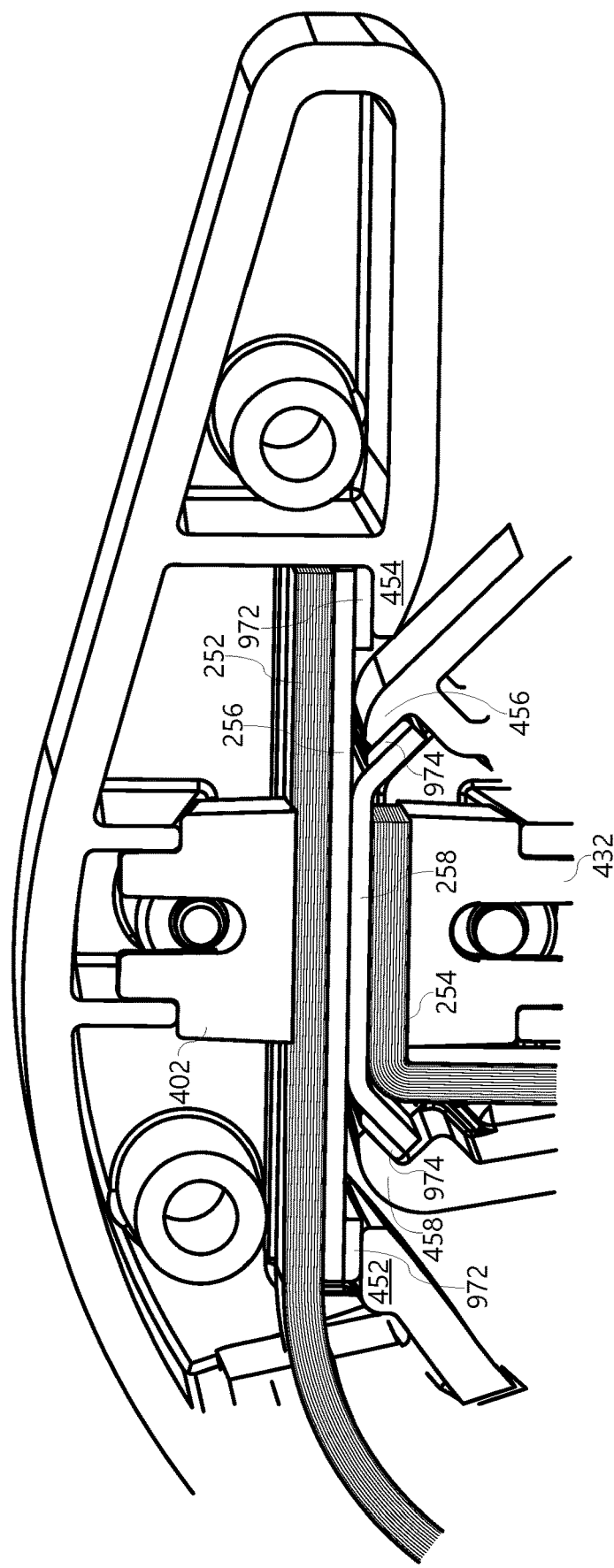
FIG. 9 illustrates a cross sectional view of a compression housing for a laminate core including a gasket between the contact plates and the contact plate guides.

FIG. 9 illustrates a cross sectional view of a compression housing for a laminate core including gaskets 972, 974 between the contact plates 256, 258 and the contact plate guides 452, 454, 456, 458. In various embodiments, a gasket may be used to provide additional sealing of the housing. The sealing may be useful to reduce entrance of elements into the housing. In use, the electronic devices described herein may be mounted on external overhead power lines, and subjected to wind, snow, rain, ice, falling debris, blowing debris, and the like. In order to keep such elements out of the electronic device, one or more seals may be used. In several embodiments, to increase protection of the internal components of the electronic device, the interior of the device may be filled with a potting material. The gaskets between the contact plates and the contact plate guides may be useful to provide a seal such that the potting material does not leak out of the electronic device at the junctions of the contact plates and contact plate guides.

According to several embodiments, compression of the laminate core 202 by the compression wedge 402, 432 may also provide compression of the gaskets 972, 974 between the contact plates 256, 258 and contact plate guides 452, 454, 456, 458. Such compression may increase the cooperation of the contact plate 256, 258 with the contact plate guides 452, 454, 456, 458, and improve the functioning of the device to retain potting material and/or provide a barrier to elements that may otherwise enter the electronic device.

The gaskets 972, 974 may be formed from a compressible material. In various embodiments, the gaskets may be formed from a plastic, rubber, silicone polymer, carbon polymer, neoprene, urethane, nylon, ethylene-propylene-diene monomer (EPDM), or the like.

In certain embodiments, the gaskets 972, 974 may include a draft. The draft may cooperate with a draft of the contact plate guide such that compression of the gasket between the contact plate and the contact plate guide increases a contact area between the gasket and the contact plate guide.

Figure 10:
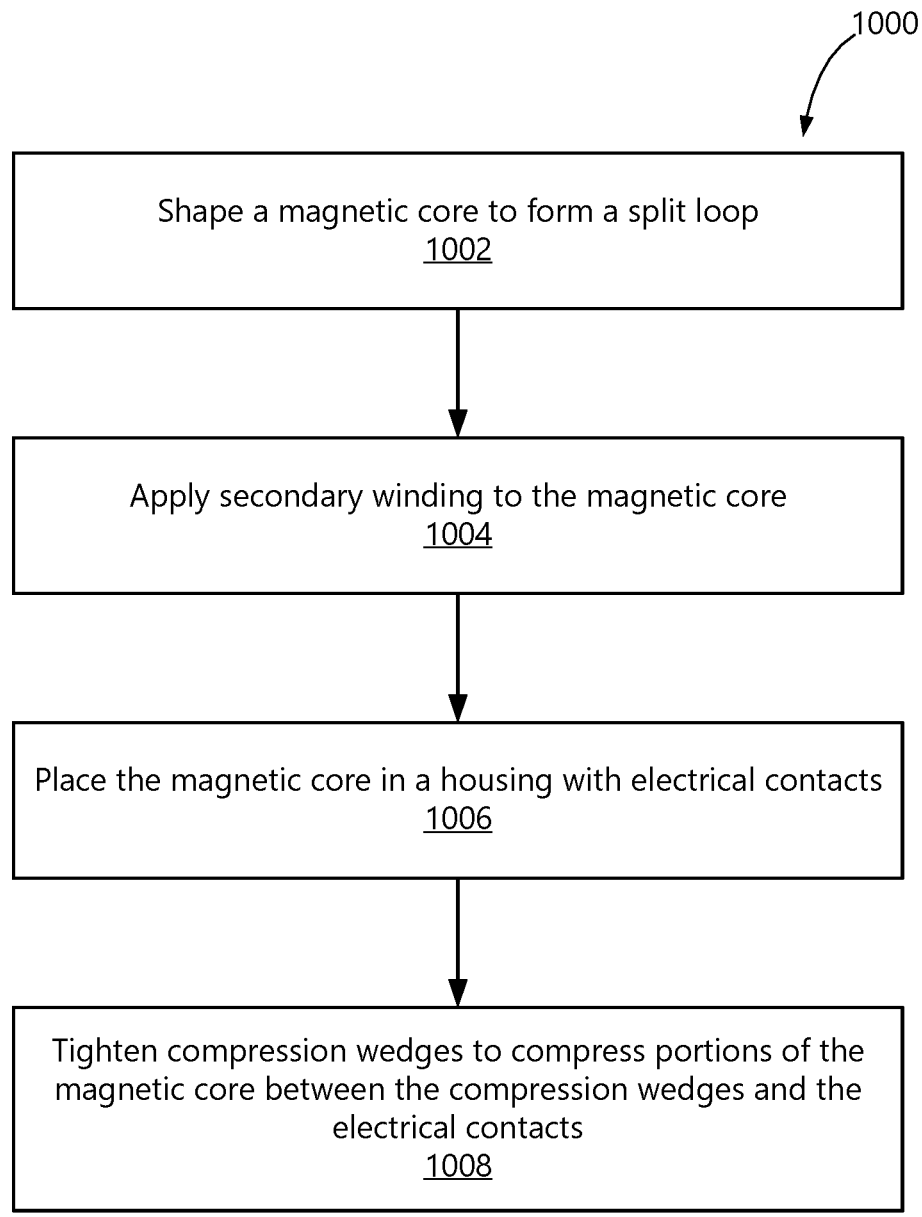
FIG. 10 illustrates a flow chart of a method for manufacturing an electronic device with a current transformer and a compression housing.

FIG. 10 illustrates a flow chart of a method 1000 for manufacturing a current transformer with a compression housing. As illustrated, a manufacturer may shape 1002 a magnetic core to form a split loop. The magnetic core may comprise laminations. In some embodiments, the preformed core may be an open shape (e.g., a U-shape or a J-shape) that is closable. The loop may be fashioned into a variety of shapes. For example, the loop may be rounded, elliptical, rectangular, spiral, or toroidal.

The manufacturer may apply a secondary winding to the magnetic core 1004. The secondary winding may be applied by wrapping the magnetic core with a continuous wire. The secondary winding may be applied by wrapping a flexible bobbin with continuous wire and sliding the wrapped flexible bobbin onto the core. The flexible bobbin may be one continuous segment with a duct extending through the flexible bobbin. For example, in some embodiments, the manufacturer may mold the flexible bobbin from rubber into one continuous rubber member. In some embodiments, the flexible bobbin may be constructed by layering and/or sintering rubberized filament to form one continuous rubberized member.

The manufacturer may place the magnetic core into a housing with electrical contacts 1006 such as the housings described in various embodiments herein. The housing may include compression wedges. The compression wedges may be inserted after placement of the magnetic core into the housing. The compression wedges may include screws as mounting members. The mounting members may alternatively be placed into the compression wedges after placement of the compression wedges. The mounting members and compression wedges may be placed into the housing before placement of the magnetic core.

The manufacturer may tighten the compression wedges to compress portions of the magnetic core between the compression wedges and the electrical contacts 1008. The tightening may be performed by tightening the screws as mounting members. As described herein, according to several embodiments, tightening of the mounting members may force the compression wedges in a direction toward a mounting surface of the housing. Due to cooperation of a tapered ramp of the compression wedge and a tapered guide ramp of the housing, forcing the compression wedge in a direction toward the mounting surface of the housing may cause a force in the direction of a compression surface of the compression wedge toward the portion of the core. Tightening of the mounting member may cause compression of the portion of the magnetizing core between the compression wedge and the electrical contact.

In various embodiments, the tightening may be performed to drive the compression wedge such that the contact surface 616 of the compression wedge is in contact with the mounting member (314 or 320).

Due to the compression, the core may be securely held in place in the housing. Further, due to the compression, gaps between laminate layers may be reduced. Due to the compression, gaps between the portions of the core and the electrical contacts may be reduced. Due to the compression, the electrical conductivity between the core and contacts may be increased. Due to the compression, core losses may be reduced.

Accordingly, the compression housing for the laminate core of an inductive current transformer may result in an increased efficiency of the current transformer. Furthermore, the compression housing for the laminate core of the inductive current transformer may result in an increased accuracy of the current transformer.

Any methods disclosed herein include one or more steps or actions for performing the described method. The method steps and/or actions may be interchanged with one another. In other words, unless a specific order of steps or actions is required for proper operation of the embodiment, the order and/or use of specific steps and/or actions may be modified.

Reference throughout this specification to "an embodiment" or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

The components of the disclosed embodiments, as generally described and illustrated in the figures herein, could be arranged and designed in a wide variety of different configurations. Thus, the embodiments and methods of the disclosure are not intended to limit the scope of the disclosure, as claimed, but are merely representative of possible embodiments of the disclosure.

Similarly, it should be appreciated by one of skill in the art with the benefit of this disclosure that in the above description of embodiments, various features are sometimes grouped together in a single embodiment, figure, or description thereof for the purpose of streamlining the disclosure. This method of disclosure, however, is not to be interpreted as reflecting an intention that any claim requires more features than those expressly recited in that claim. Rather, as the following claims reflect, inventive aspects lie in a combination of fewer than all features of any single foregoing disclosed embodiment. Thus, the claims following this Detailed Description are hereby expressly incorporated into this Detailed Description, with each claim standing on its own as a separate embodiment. This disclosure includes all permutations of the independent claims with their dependent claims.

Recitation in the claims of the term "first" with respect to a feature or element does not necessarily imply the existence of a second or additional such feature or element. It will be apparent to those having skill in the art that changes may be made to the details of the above-described embodiments without departing from the underlying principles of the present disclosure.

It will be understood by those having skill in the art that changes may be made to the details of the above-described embodiments without departing from the underlying principles of the invention. Embodiments of the invention in which an exclusive property or privilege is claimed are defined as follows.

What is claimed is:

1. An electronic device for obtaining current measurements from a primary conductor, comprising:
    a flexible split-core current transformer that includes:
        a laminate core;
        a secondary winding axially coiled around a portion of the laminate core; and
        a first unwound portion and a second unwound portion separated by the secondary winding;
    a housing operable between an open configuration and a closed configuration, comprising:
        a first tapered guide ramp; and,
        a second tapered guide ramp;
    a first contact plate and a second contact plate mounted in the housing to provide an electrical contact between the first contact plate and the second contact plate with the housing in the closed configuration;
    a first compression wedge comprising a first tapered ramp in cooperation with the first tapered guide ramp, and a first compression surface to provide compression to the first unwound portion of the laminate core between the first compression surface and the first contact plate; and
    a second compression wedge comprising a second tapered ramp in cooperation with the second tapered guide ramp, and a second compression surface to provide compression to the second unwound portion of the laminate core between the second compression surface and the second contact plate.

2. The electronic device of claim 1, further comprising a first mounting member to adjustably mount the first compression wedge to the housing.

3. The electronic device of claim 2, wherein the first mounting member comprises a screw.

4. The electronic device of claim 1, wherein the first tapered guide ramp comprises a first pair of tapered guide ramps, and the first compression wedge comprises a first pair of tapered ramps in cooperation with the first pair of tapered guide ramps.

5. The electronic device of claim 1, wherein the first compression wedge comprises a setback for travel between the first compression wedge and the housing.

6. The electronic device of claim 5, wherein the housing comprises a mounting surface to coordinate with the compression wedge setback.

7. The electronic device of claim 6, wherein the mounting surface extends from the housing partially into the setback.

8. The electronic device of claim 1, wherein the second contact plate extends from the housing.

9. The electronic device of claim 1, wherein the first and second compression wedges comprise adjustable compression wedges.

10. An electronic device for obtaining current measurements from a primary conductor, comprising:
    a flexible split-core current transformer that includes:
        a laminate core;
        a secondary winding axially coiled around a portion of the laminate core; and
        a first unwound portion and a second unwound portion separated by the secondary winding;
    a housing operable between an open configuration and a closed configuration, comprising a first tapered guide ramp
    a first contact plate mounted in the housing to provide an electrical contact between the first unwound portion and the second unwound portion with the housing in the closed configuration;
    a first compression wedge comprising a first tapered ramp in cooperation with the first tapered guide ramp, and a first compression surface to provide compression to the first unwound portion of the laminate core between the first compression surface and the first contact plate.

11. The electronic device of claim 10, further comprising a first mounting member to adjustably mount the first compression wedge to the housing.

12. The electronic device of claim 11, wherein the first mounting member comprises a screw.

13. The electronic device of claim 10, wherein the first tapered guide ramp comprises a first pair of tapered guide ramps, and the first compression wedge comprises a first pair of tapered ramps in cooperation with the first pair of tapered guide ramps.

14. The electronic device of claim 10, wherein the first compression wedge comprises a setback for travel between the first compression wedge and the housing.

15. The electronic device of claim 14, wherein the housing comprises a mounting surface to coordinate with the compression wedge setback.

16. The electronic device of claim 15, wherein the mounting surface extends from the housing partially into the setback.

* * * * *